(12) United States Patent
Pan et al.

(10) Patent No.: US 6,696,880 B2
(45) Date of Patent: Feb. 24, 2004

(54) HIGH VOLTAGE SWITCH SUITABLE FOR NON-VOLATILE MEMORIES

(75) Inventors: Feng Pan, San Jose, CA (US); Khandker N. Quader, Sunnyvale, CA (US)

(73) Assignee: SanDisk Corporation, Sunnyvale, CA (US)

(*) Notice: Subject to any disclaimer, the term of this patent is extended or adjusted under 35 U.S.C. 154(b) by 0 days.

(21) Appl. No.: 10/014,161

(22) Filed: Nov. 9, 2001

(65) Prior Publication Data

US 2003/0090311 A1 May 15, 2003

(51) Int. Cl.[7] .............................................. H03K 17/16
(52) U.S. Cl. .......................... 327/390; 327/589; 326/88; 365/230.08
(58) Field of Search ................................. 327/389, 390, 327/391, 392, 398, 399, 400, 401, 581, 589; 326/88, 92; 365/189.05, 189.06, 230.08

(56) References Cited

U.S. PATENT DOCUMENTS

| | | | |
|---|---|---|---|
| 4,580,067 A | * | 4/1986 | Proebsting et al. ......... 327/108 |
| 4,678,941 A | | 7/1987 | Chao et al. .................. 326/107 |
| 4,954,731 A | * | 9/1990 | Dhong et al. ................. 326/88 |
| 5,512,845 A | | 4/1996 | Yuh ............................. 326/88 |
| 5,723,985 A | | 3/1998 | Van Tran et al. ............. 326/81 |
| 5,790,453 A | | 8/1998 | Chevallier ............. 365/185.03 |
| 5,912,838 A | | 6/1999 | Chevallier ............. 365/185.03 |
| 5,940,333 A | | 8/1999 | Chung .................... 365/189.09 |
| 6,044,012 A | | 3/2000 | Rao et al. ..................... 365/182 |
| 6,078,518 A | | 6/2000 | Chevallier ............. 365/185.03 |
| 6,166,982 A | | 12/2000 | Murray et al. ............... 365/226 |
| 6,169,432 B1 | | 1/2001 | Sharpe-Geisler ............ 327/112 |

FOREIGN PATENT DOCUMENTS

| | | |
|---|---|---|
| JP | 3-41694 | 2/1991 |
| JP | 9-139079 | 5/1997 |
| JP | 11-126478 | 5/1999 |

OTHER PUBLICATIONS

PCT International Search Report mailed Mar. 27, 2003.

* cited by examiner

Primary Examiner—Timothy P. Callahan
Assistant Examiner—An T. Luu
(74) Attorney, Agent, or Firm—Parsons Hsue & de Runtz LLP

(57) ABSTRACT

The invention utilizes a boost-strap method to improve switch operation in a design that is particularly advantageous for supplying high voltages within a low voltage design. A native NMOS transistor, a PMOS transistor, and a capacitor are connected in series between the high voltage source and the output, where the gate of the native NMOS is connect to the output. In an initialization phase, the plate of the capacitor connected to the output is precharged by receiving the input signal while the other plate of the capacitor is held near ground. In a subsequent enable phase, the native NMOS and PMOS transistors are turned on and the high voltage is supplied to the output.

46 Claims, 8 Drawing Sheets

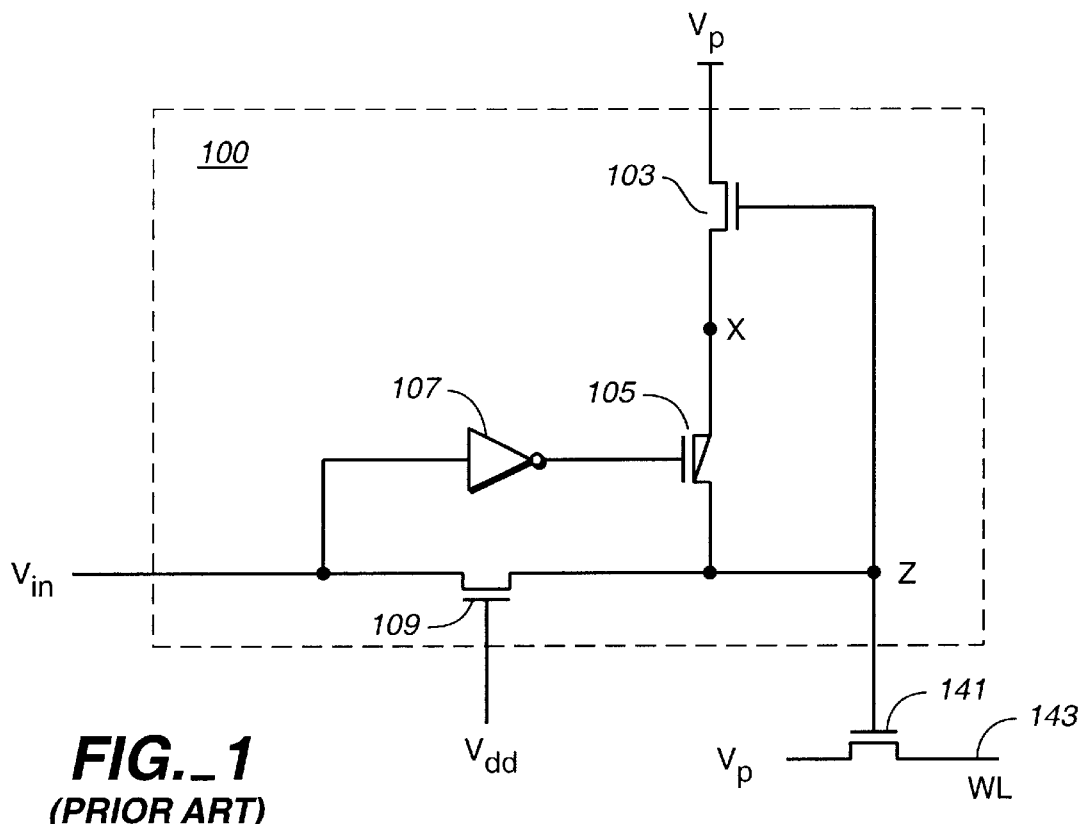
FIG._1
(PRIOR ART)
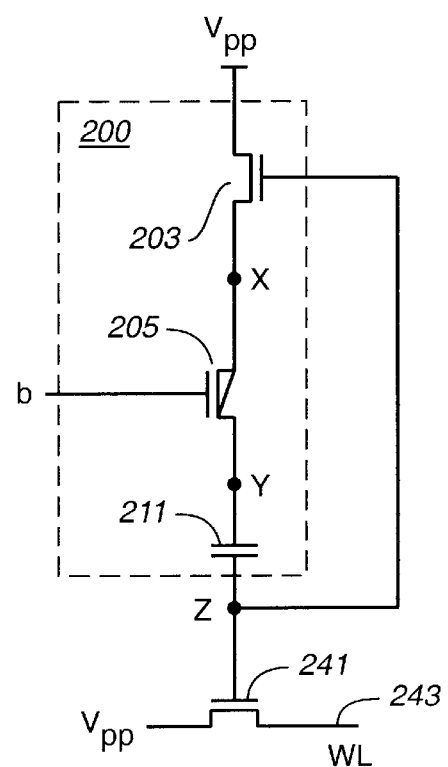
FIG._2

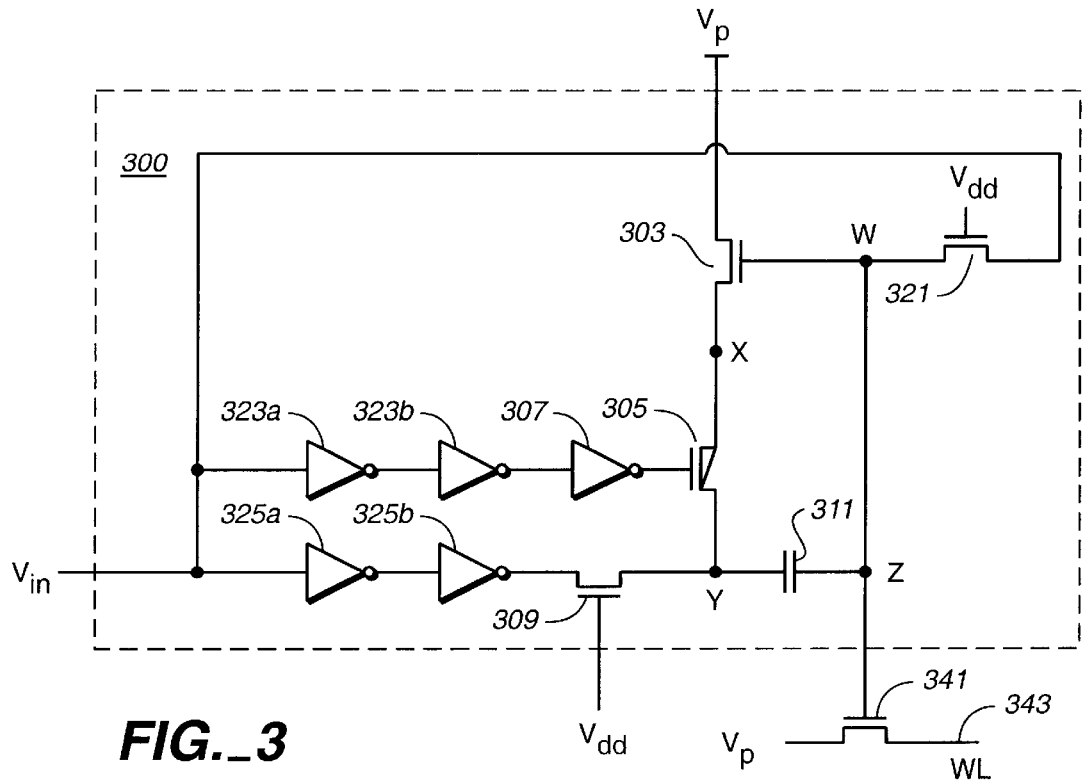
FIG._3
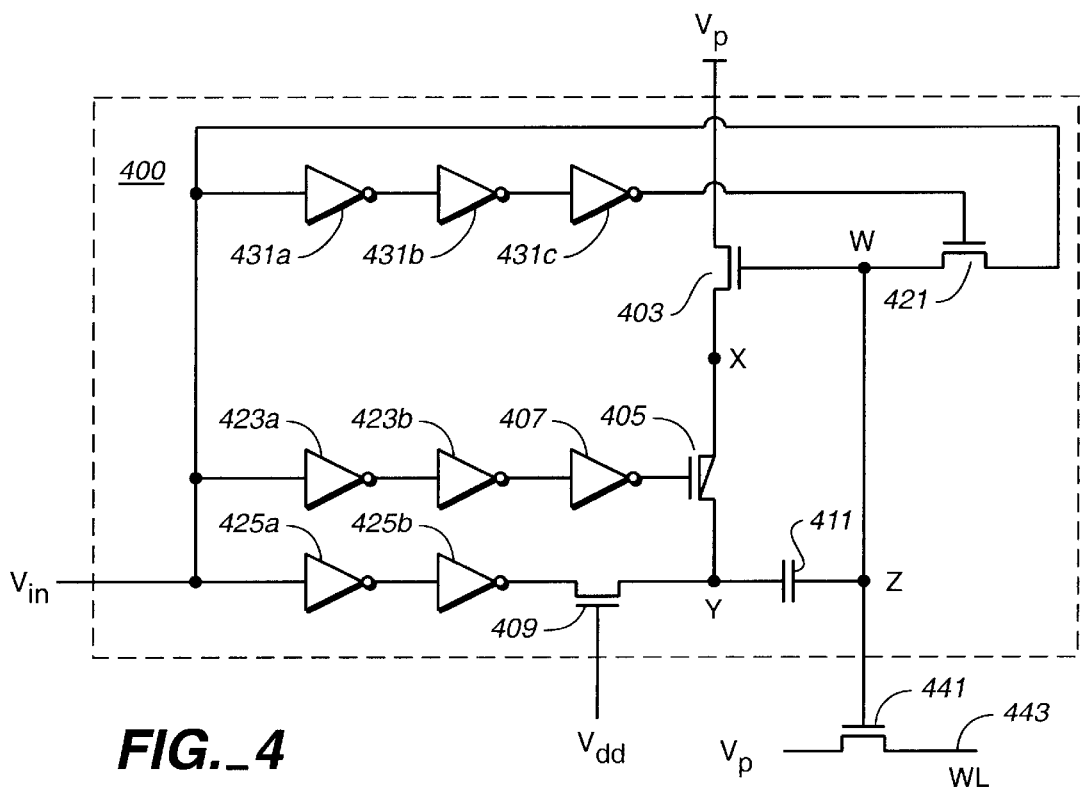
FIG._4

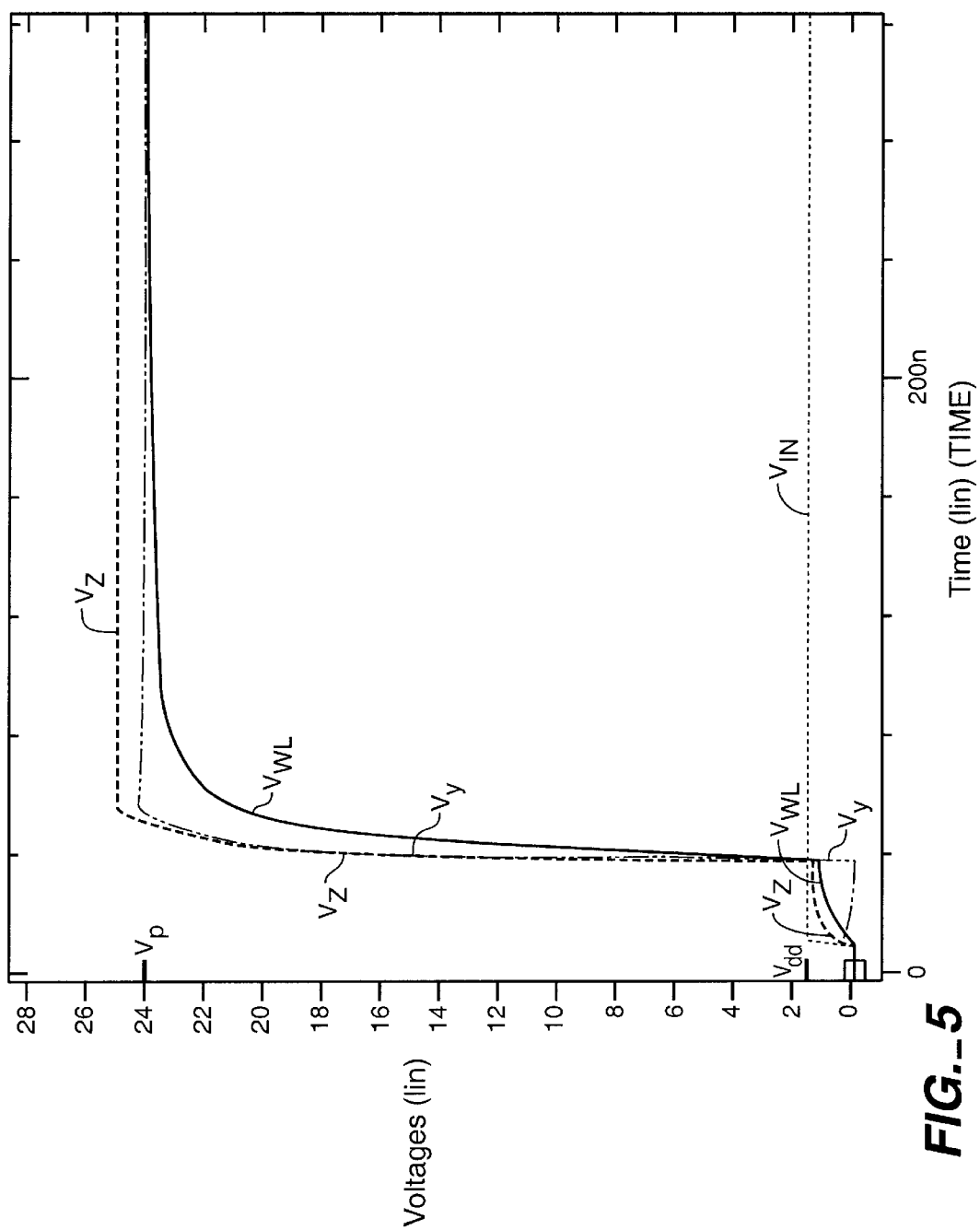
FIG._5

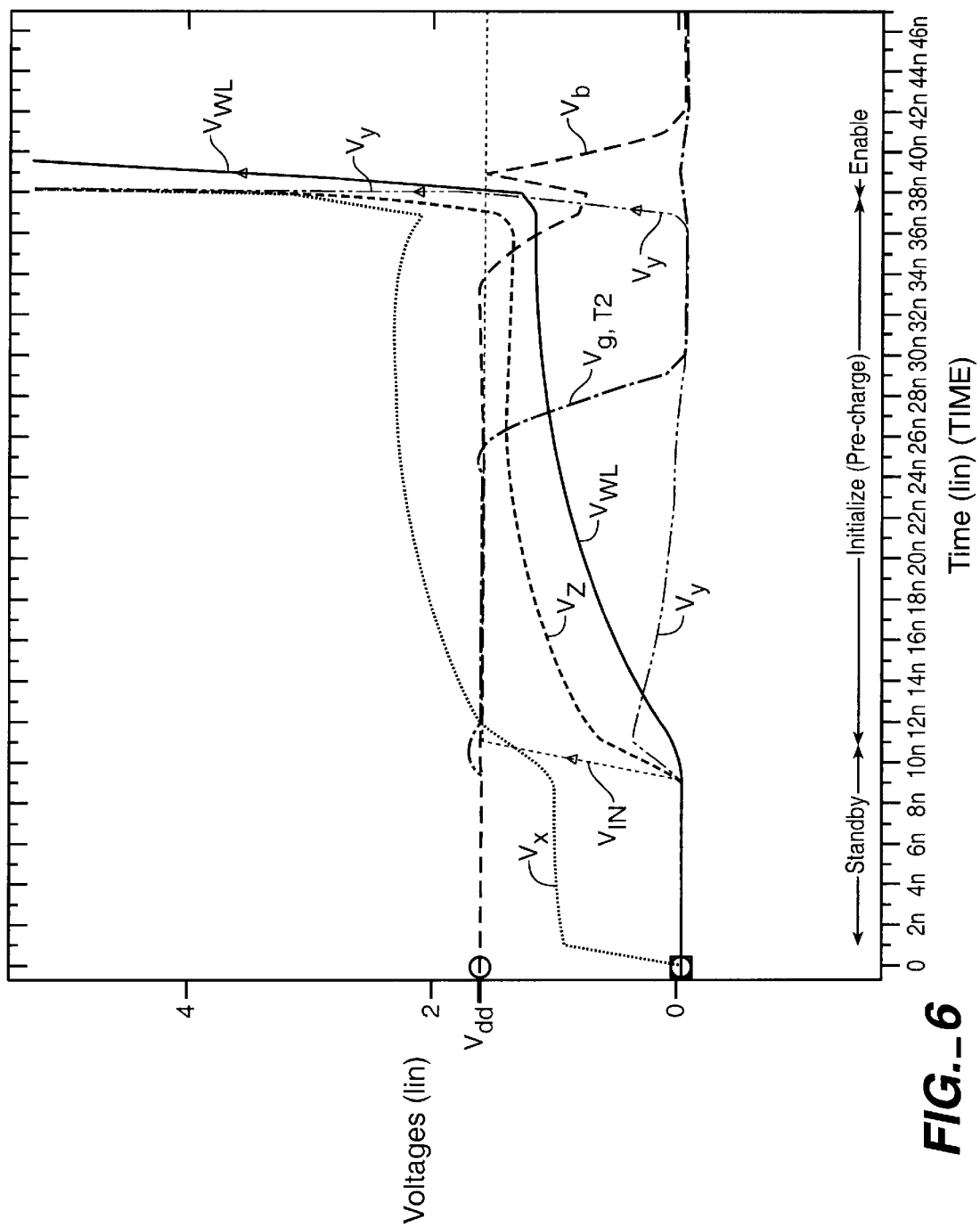
FIG._6

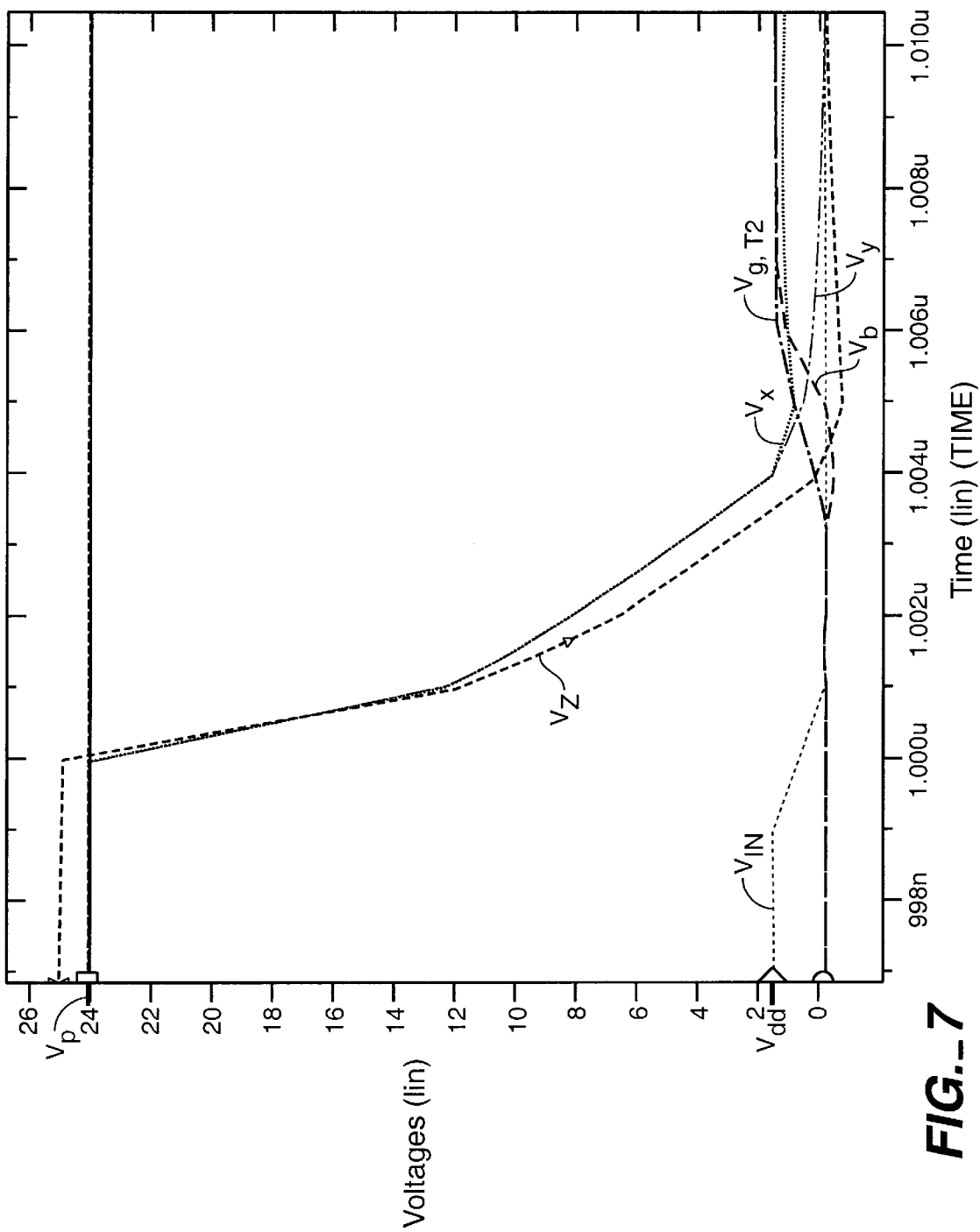
FIG._7

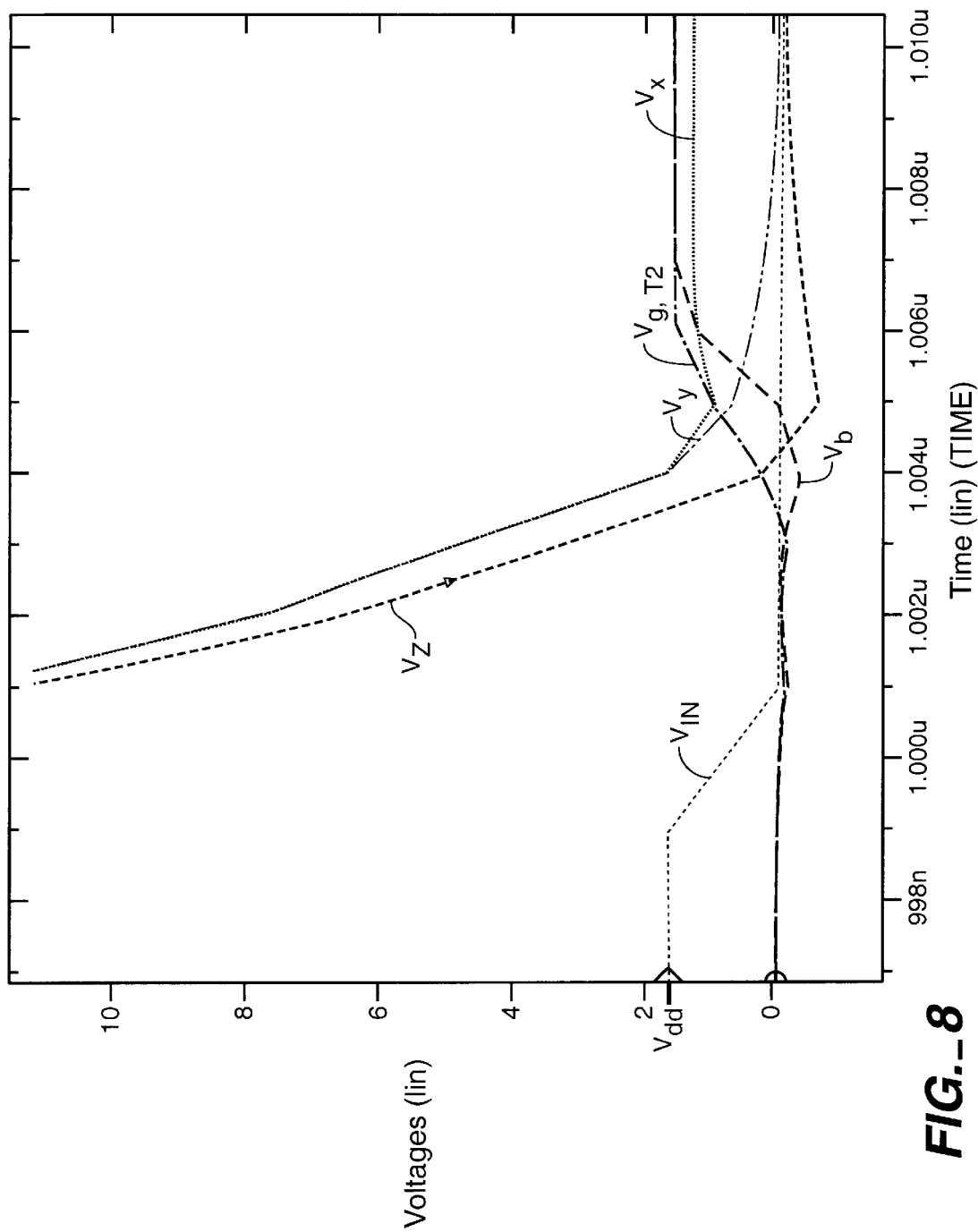
FIG._8

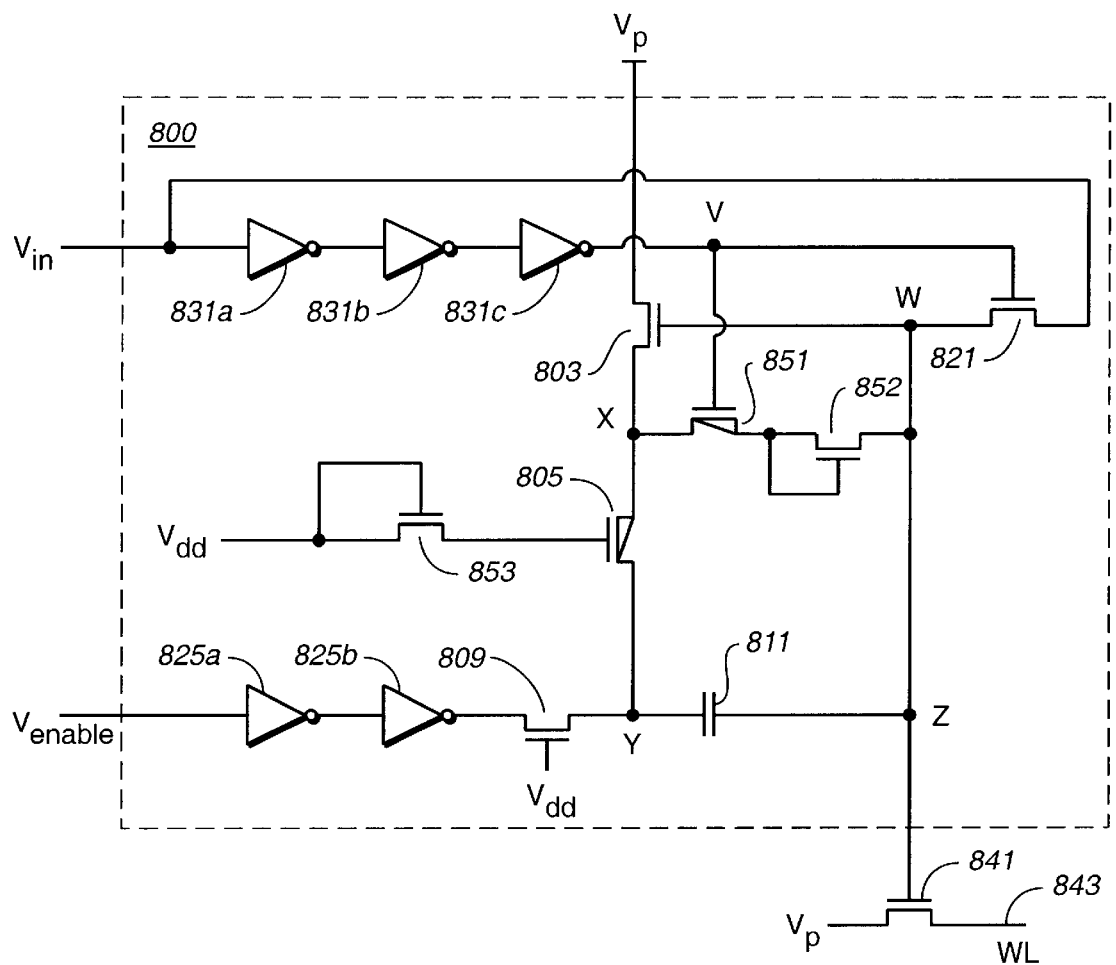
FIG._9

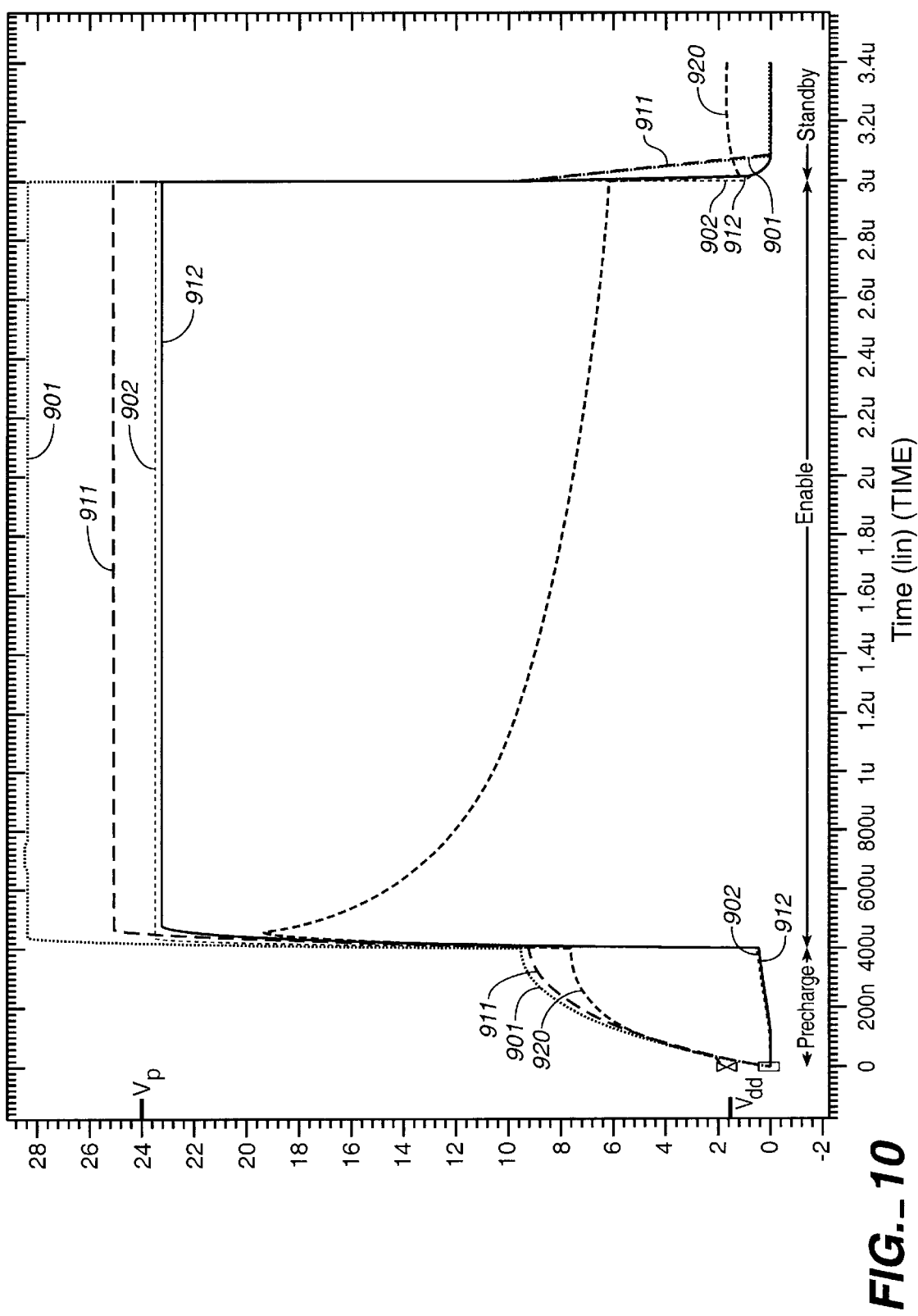
FIG._10

HIGH VOLTAGE SWITCH SUITABLE FOR NON-VOLATILE MEMORIES

BACKGROUND OF THE INVENTION

1. Field of the Invention

This invention relates generally to integrated circuit semiconductor devices, and, more specifically, to high voltage switches.

2. Background Information

In an integrated circuit, it is common to need a circuit to provide a voltage from a voltage source to an output in response to an input signal. An example is a wordline select circuit of in a non-volatile memory. In such a circuit, a relatively high programming voltage is supplied to a wordline in response to an input signal at the device to device logic level. For example, in fairly typical values for a NOR type FLASH memory, 8–10V is provided on a wordline in response to an input going from ground to "high" value of 3–5V. To improve the operation of the circuit, it is important that the voltage on the wordline reaches its full value quickly in response to the input going high.

Many designs exist for such switches. A number of common designs use an NMOS transistors and a local charge pump to raise the gate voltage values used to turn on the transistor and pass the high voltage from the source to the output. Due to the body bias of the NMOS transistors and charge pump ramping speed, these switches generally take a relatively long time to reach the passing voltage level need to pass the full high voltage. These problems are aggravated by both higher programming voltage level needed and lower device supply voltages as these combine to make it harder to pump efficiently and timely due to body effects of NMOS transistors in the charge pump.

SUMMARY OF THE INVENTION

The present invention utilizes a boost-strap method to improve switch operation in a design that is particularly advantageous for supplying high voltages within a low voltage design. The invention utilizes a native NMOS transistor, a PMOS transistor, and a capacitor connected in series between the high voltage source and the output. In a first embodiment, a native NMOS transistor is connected between the voltage source and a first node, a PMOS device being connected between this first node and a second node, and a capacitor being connected between the second node and the output. The input signal is supplied through an intrinsic NMOS to the gate of the native NMOS device and output side of the capacitor, with the delayed input supplied to the node between the capacitor and the PMOS and, in inverted form, to the gate of the PMOS.

In response to the input signal going high, the delay allows for an initialization phase to precharge the capacitor and partially turn on the native NMOS device. After the delay, the PMOS is turned on and the native NMOS is further turned on by its gate being boosted up by the capacitor to allow the voltage from the source to boost up the output. The use of the delay for precharging the capacitor allows the output to be pre-charged to close to the full high logic level. During the boost phase, due to the predefined boosting ratio, the output is raised above the value of the high voltage supply. This higher than high voltage supply voltage will allow better over drive to overcome the threshold voltage of body-biased native NMOS transistors.

The non-delayed input is supplied to the gate of the native NMOS and the delayed input is supplied to the node between the PMOS in the first exemplary embodiments. In one variation of these first embodiments, the input is supplied to the gate of the native NMOS device and the output side of the capacitor through a second native NMOS device whose gate is connected to receive the input in an inverted, delayed form. The use of the second native NMOS allows for a better overdrive as the threshold voltage of the second native NMOS will provide a higher voltage to the first NMOS's gate in the initialization phase.

A further exemplary embodiment adds an additional path from the node between the native NMOS and the PMOS to the output and uses an enable signal in addition to the input signal. The enable signal is a delayed version of the input signal when the input signal is being asserted and the same as the input when it is de-asserted. In the initialization phase, when the input signal has gone high but the enable signal is still low, the additional path is used to equalize between the gate and drain of the native NMOS in the initialization phase and is cut off in other cases. In a further aspect of this embodiment, instead of supplying the input to the gate of the PMOS transistor, the gate is diode-connected to the chip voltage supply, and it level can be altered through the coupling between the source-drain junction and its channel. In both this and the other embodiments, the PMOS is designed to be tolerant of high voltage levels across its oxide.

Additional aspects, features and advantages of the present invention are included in the following description of specific representative embodiments, which description should be taken in conjunction with the accompanying drawings.

BRIEF DESCRIPTION OF THE DRAWINGS

FIG. 1 shows a switch using a native NMOS and PMOS to supply a high voltage to the gate of a transistor.

FIG. 2 presents the elements of the present invention between the voltage source and the output.

FIG. 3 is a first exemplary embodiment of the present invention.

FIG. 4 is a second exemplary embodiment of the present invention.

FIG. 5 shows the select response of the second exemplary embodiment of the present invention.

FIG. 6 is an enlarged detail of FIG. 5.

FIG. 7 shows the deselect response of the second exemplary embodiment of the present invention.

FIG. 8 is an enlarged detail of FIG. 7.

FIG. 9 is a third exemplary embodiment of the present invention.

FIG. 10 shows the response of the third exemplary embodiment of the present invention.

DESCRIPTION OF REPRESENTATIVE EMBODIMENTS

FIG. 1 shows another prior design that overcomes many of the problems described in the Background section. The switch 100 supplies a voltage derived from the voltage source $V_p$ in response to an input signal $V_{in}$ to, in this case, the gate of a transistor 141 that supplies the voltage $V_p$ to a wordline WL 143. The switch supplies the voltage $V_p$ to the output through a native NMOS transistor 103 and PMOS transistor 105 connected in series. The gate of the PMOS transistor 105 is connected to the input $V_{in}$ through inverter 107. A transistor 109, whose gate is connected to $V_{dd}$, is connected between the input voltage $V_{in}$ and output node Z, that is also connected to the gate of NMOS 103.

In an application as a wordline select circuit, $V_p$ is the passing voltage and may have a value of 20V or more in the case of a NAND memory structure. In the examples below, $V_p$=24V is used. In a low voltage circuit, the "low" value of $V_{in}$ will taken to be ground and the "high" value $V_{dd}$ as 2V or less, for example 1.6V. Examples of non-volatile memories where a high voltage switch such as described here can be utilized are given in U.S. patent application Ser. No. 09/893,277, entitled "Operating Techniques for Reducing Effects of Coupling Between Storage Elements of a Non-Volatile Memory Operated in Multiple Data States", filed on Jun. 27, 2001, and references incorporated therein, all of which are hereby incorporated herein by this application.

To see the function of the circuit in FIG. 1, consider its operation starting from the input being low, $V_{in}$=0V, such as when the wordline 143 is deselected and switch 100 is in standby mode. The threshold voltage of PMOS can be taken as –1V. Due to inverter 107, the gate of PMOS 105 is held high $V_{dd}$ and the PMOS is consequently turned off. The gate of the NMOS 103 is at 0V and is also consequently turned off. As NMOS 103 is a native device, it has a negative threshold value, say –0.8V, and node X would be at about 0.8V. Node Z is at ground and transistor 141 will be off, so that word line 143 is disconnected from the voltage supply.

When $V_{in}$ increase from ground to $V_{dd}$=1.6V, if transistor 109 is taken to have a threshold voltage of 0.8V, $V_Z$ will be charged at 0.8V and NMOS 103 will begin to turn on. The voltage on the gate of the PMOS 105 will drop to 0V and it will turn on. Consequently, the voltage at node X will go from 0.8V to 1.6V. The voltage at node Z, and at the gate of NMOS 103, will consequently rise until it reaches $V_p$. The native NMOS 103 is selected so that its threshold voltage is below 0V even with the effects of the body bias resulting from the high value of $V_p$. When $V_{in}$=$V_{dd}$, as the gate of transistor 109 is held at $V_{dd}$, transistor 109 is diode connected and no charge will leak away from node Z through NMOS 109.

The voltage $V_Z$=$V_p$ is then applied to the control gate of the transistor 141 and the high voltage is applied to the wordline WL 143. The full value of the program voltage will not be passed, however. The threshold voltage of the pass gate $V_{th}$, that may be, say, 0.8V, may increase to something like 2V due to body bias when a voltage such as $V_p$≈24V is placed on the gate. Consequently, the wordline will receive a voltage of $V_p$–$V_{th}$≈22V, or somewhat less than the full programming voltage. Thus, if $V_{WL}$ is the desired voltage on wordline WL 143, the passing voltage $V_p$ must be raised to $V_p$=$V_{WL}$+$V_{th}(V_{WL})$.

The circuit of FIG. 1 improves over the prior art as described in the Background section by using a smaller area on the device. As noted above, in order to supply a voltage of $V_{WL}$ to the wordline WL 143, a higher voltage of $V_p$=$V_{WL}$+$V_{th}(V_{WL})$ needs to be supplied to the pass gate 141 and this additional higher voltage places extra stress on the system. Additionally, it is difficult to determine exactly the exact voltage that needs to be supplied by the charge pump as the dependence of the transistor's threshold voltage on the voltage on the wordline due to body bias, $V_{th}$=f($V_{WL}$), is non-linear.

Another area where the circuit of FIG. 1 can be improved is in its speed to raise the output from ground to a high $V_p$ in response to the input. As the voltage on node Z raises and the voltage on the gate of the native device 103 increases and the voltage on the gate increases further. Again, due to body bias, the threshold voltage of transistor 103 begins to increase so that the rate of increase of $V_Z$ begins to roll off significantly, producing a long tail region above, say, 15V as it asymptotically approaches a $V_p$ of ~24V. For typical values component values in the circuit of FIG. 1, this can result in several microseconds to get the full passing voltage to the gate of word line select transistor. A discussed below, the exemplary embodiments of FIGS. 3, 4 and 9 allow a higher speed to reach the passing voltage.

The present invention improves the speed of the device in FIG. 1 by adding a capacitor in series with the transistors 103 and 105 between the output and voltage source and precharging the output side of the capacitor. The gate voltage on the pass gate 141 is also increased. These changes will be described with respect to FIG. 2 that shows the circuit elements between the voltage source and output along with various inputs and nodes.

FIG. 2 shows a native NMOS transistor 203 connected between a voltage source $V_p$ and a node X and with a gate connected to node Z. Between node X and the output at node Z the PMOS transistor 205 is connected and the input to the gate is indicated by b. Capacitor 211 has been added between the output at node Z and node Y below the PMOS transistor 205. The output is again shown connected to the gate of a transistor 241 for supplying a programming voltage to a wordline WL 243.

The present invention differs from the embodiment of FIG. 1 by initializing the circuit by precharging the lower plate of the capacitor. This is done by delaying the input to the gate of PMOS 205 and node Y, which is now differentiated form node Z by the introduction of capacitor 211. The initialization is performed by charging node Z to $V_{dd}$ while keeping node Y near 0V. By additionally precharging the capacitor, an extra voltage above the supply voltage can be supplied to help overcome the body bias of pass gate.

In FIG. 2, the initialization circuits to nodes Z and Y are not shown, although specific examples are shown in the embodiments of FIGS. 3, 4, and 9. These circuits initialize the capacitor 211 before boosting by pre-charging node Z to $V_{dd}$ while node Y is kept at 0V. During the boosting, node Z is left floating and node Y is charged from PMOS 205.

In more detail, in the standby mode when $V_{in}$=low (0V) and wordline WL 243 is deselected, the voltage on the output node Z and the gate of transistor 203 is also low, $V_Z$=0V. The input is supplied to PMOS 205 in inverted form so that $V_b$≈$V_{dd}$. The voltage at node X is set by the threshold voltage of, say –0.8V, the native NMOS 203, $V_X$≈–$V_{th,203}$ ≈0.8V. With all the given conditions, the native NMOS transistor 203 and PMOS 205 are both off.

When the input signal goes high, $V_{in}$=$V_{dd}$ and the transition/initialization phase begins. The input is supplied to node Z, so that $V_Z$≈$V_{dd}$. (As described below with respect to FIGS. 3 and 4, these values will differ from $V_{dd}$ due to being supplied through a transistor, NMOS transistor 321 in FIG. 3 and native NMOS 421 in FIG. 4.) Consequently, NMOS 203 begins to turn on some. This places the node X at $V_X$≈$V_{dd}$+(–$V_{th,203}$)≈$V_{dd}$+0.8V. As the delay to the gate of PMOS 205 and node Y is delayed, these stay at $V_b$=·$V_{dd}$ and $V_Y$=0V respectively.

Once the system is initialized, it is fully enabled by providing the delayed input in inverted form to b so that $V_b$=0V and the PMOS will turn on. As with FIG. 1, since both transistors are on nodes X and Y will then go to the value of the voltage source, $V_X$=$V_Y$=$V_p$, as will the output at node Z. However, due to the initialization, this transition will occur more quickly by charging up node Z in transition for a boost-strap effect. As described below with respect to FIG. 4, by precharging node Z with $V_{dd}$ through transistor 421, the output these voltage can be raised above $V_p$, $V_{dd} < V_Z < V_p + V_{dd}$, to offset body bias effects, allowing node X to reach $V_p$ faster and also allowing the full programming voltage to reach the wordline quicker. To keep the charge on nodes Y and Z after initialization, the precharging devices are diode connected to avoid charge leaking away.

FIG. 3 shows a first exemplary embodiment of the present invention that implements the process described with respect to FIG. 2. This circuit is similar to that of FIG. 1, but has a number of added elements that implement the process described with respect to FIG. 2. A native NMOS transistor 303 is connected in series through node X with the PMOS 305 between the voltage source at $V_p$ and the output at node Z. The capacitor 311 is added between node Y below PMOS and node Z. To initialize the capacitor for bootstrap effect, the input is now driving node W and the lower plate of capacitor 311, as well as node Y. (Node W is shown distinct from node Z to simplify the discussion.) The gate of transistor 321 is connected to $V_{dd}$ so that when the input goes high, this will act as a diode to keep the high voltage from flowing back to the input. The delay for $V_{in}$ to node Y and the gate of PMOS 305 is respectively provided by the pairs of inverters 325a, 325b and 323a, 323b. Inverter 307 and transistor 309 provide the same function as the corresponding elements of FIG. 1.

FIG. 4 shows a second exemplary embodiment. The embodiment of FIG. 4 differs from that of FIG. 3 in that transistor 421, which is now a native NMOS device instead of a regular NMOS, is now connected with its gate to receiving a delayed, inverted input. In the circuit of FIG. 2, the higher the voltage on the node Z and during the initialization, the quicker the full programming voltage will be supplied to the wordline WL 243. This is due to the higher voltage on the output side of the capacitor 211, the higher voltage on the gate of transistor 203, and the extra voltage on the gates of transistors 203 and 241 that helps offset the body bias as the voltage through these transistors approach $V_p$. In the embodiment of FIG. 4, a native NMOS device 421, with a $V_{th} \approx -0.8V$, replaces the non-native transistor 321 of FIG. 3, with $V_{th} \approx +0.8V$. The negative threshold value of the native device 421 produces the extra voltage on node W during the initialization phase. Consequently the embodiment of FIG. 4 provides improved performance at the cost of some extra complexity over that of FIG. 3.

The gate of transistor 421 is connected to receive the delayed, inverted output. During standby when $V_{in}=0V$, the gate of NMOS 421 is at $V_{dd}$ and transistor 421 is on. When $V_{in}$ first goes high, transistor 421 stays on due to the delay from the inverters 431a, 431b, and 431c and node W goes to near $V_{dd}$. After the delay, the gate of NMOS 421 will go low and turn the transistor off at the same time that PMOS 405 turns on, thereby trapping the charge on nodes W and Z and preventing it from flowing back out the input.

In both of FIGS. 3 and 4, the delays are implemented through the use of inverters. More generally, other circuit elements could be utilized to implement this function. Also, in both of these figures a pair of transistors (309 and 321, 409 and 421) are used to allow the precharging of nodes Y and Z during the initialization phase and prevent the charge leaking away during boosting. More generally, other circuit elements could also be utilized to implement these functions.

FIGS. 5–8 are a simulation demonstrating the operation of the exemplary embodiment of FIG. 4 using the values $V_{dd}=1.6V$ and $V_p=24V$. FIG. 5 shows the select process where the input goes from a low value $V_{in}=0V$ to a high value of $V_{in}=V_{dd}$. During the initialization phase, $V_Z$ increases from ground to near $V_{dd}$ as the input is supplied to the output side of the capacitor, while the level between the capacitor and the PMOS stays low, $V_Y=0V$. After the delay, $V_Y$ and $V_Z$ rapidly increases to near $V_p$ and $V_p+V_{dd}-\Delta$, respectively, where $\Delta$ is design dependant and depends on the capacitance ratio between the boosting capacitor and the output node loading capacitance. The voltage on the wordline WL 443, $V_{WL}$, follows the voltage $V_Z$ on the select gate 441, rising to near $V_{dd}$ during initialization and to $V_p$ after the delay. Note that during the enable phase, $V_Z$ is above $V_Y$ providing the extra voltage on the gate to offset the body bias of transistor 441 that allows $V_{WL}$ to approach $V_p$. The tail of the $V_{WL}$ curve is also shortened compared t embodiment of FIG. 1, which typically would require 3–4 μs to pass 24V to the wordline.

FIG. 6 is a detail of FIG. 5. The standby state begins at about 2 ns once node X is charged up. In this phase, the gate of PMOS 405 ($V_b$) and the gate of transistor 421 ($V_{g,T2}$) are both at $V_{dd}$. The value of $V_X$ is due to the negative threshold of NMOS 403. At about 9 ns, the input goes high, $V_{in}=V_{dd}$, and the output $V_Z$ begins to rise to near $V_{dd}$, followed by $V_{WL}$. $V_X$ also rises as $V_W=V_Z$, turning transistor 403 partially on. After the delay, the voltage on the gate of transistor 421 ($V_{g,T2}$) goes low, trapping the voltage on node Z, and transistor 409 is diode connected so there is no more pull down on node Y and it begins to rise also, and $V_b$ goes low, turning on PMOS 403, at which time $V_X$ and $V_Y$ all go towards $V_p$, with $V_Z$ going to $V_p+\Delta$, followed by $V_{WL}$.

The corresponding de-select process is shown in FIG. 7, with the details of the delay portion of this figure shown in FIG. 8. The internal nodes are discharged through transistors 421 and 409.

The PMOS transistor (405 in FIG. 4) in the present invention will pass the voltage $V_p$, which may be 24V or higher. The voltage on the source is that of node X, $V_s=V_X$, the voltage on the drain is that of node Y, $V_d=V_Y$, the well (or body) voltage, $V_w$, is tied to the higher of these, and the voltage at the gate is $V_g=V_b$. During standby, using the exemplary values, $V_g=V_{dd}$, $V_s=V_b \approx 0.8V$, $V_d=0V$; during initialization, $V_g=V_{dd}$, $V_s=V_b \approx V_{dd}+0.8V$, $V_d=0V$; and during enable $V_g=0V$, $V_s=V_b=V_d=V_p$. Thus, for a low voltage device with, say, $V_{dd}=1.6V$, the voltage between the source and drain will not exceed about 2.4V, as can be seen be by comparing the $V_X$ and $V_Y$ curves in FIG. 6.

The voltage difference between the gate and the channel is, however, the full programming voltage $V_p$ during the enable phase. Consequently, the present invention employs a thick gate oxide for the PMOS transistors 305 and 405 of FIGS. 3 and 4, respectively. As the final output voltage depends on the size of the capacitor, it needs to have a sufficient size to maintain the desired output. This is discussed further below with respect to the embodiment of FIG. 9, but here the term in the parasitic capacitance $C_2$ due to transistor 852 in FIG. 9 is lacking.

FIG. 9 presents a third exemplary embodiment. This embodiment differs from that of FIG. 4 in several respects. The first of these is that a path has been added between node X and the output at node Z. The second is that the gate of the PMOS transistor between nodes X and Y and the left hand connection of the transistor connected to node Y are no longer connected to receive $V_{in}$.

The input signal is now applied only to node W through transistor 821, which is again preferable a native NMOS device, and in inverted, delayed form to the gate of transistor 821 and the added PMOS transistor 851. The delay and inversion of the input signal is again implemented here by the set of inverters 831a–c. Node W is again connected to the native NMOS 803. In this embodiment, the node X at the lower end of transistor 803 has the new connection to node Z through the PMOS 851 and the diode connected NMOS 852, which is also preferably a native device or low threshold voltage NMOS.

PMOS 805 has its gate connected to $V_{dd}$ through the diode connected transistor 853. Rather than being turned on by the delayed, inverted version of the input signal, PMOS 853 operation is now determined by the relative levels at nodes X and Y and its gate, as will be described below.

NMOS transistor 809 is connected as before, except that it now receives a delayed version of the signal $V_{enable}$ through the pair of inverters instead of $V_{in}$. The enable signal is a delayed version of the input signal on a rising waveform and the same as the input signal on a falling waveform, as described more fully below. Capacitor 811 is connected as in the other embodiments, although its value may differ here. The output node Z is again shown connected to the gate of a select transistor 841 for supplying the programming voltage to a word line WL 843, although it can easily be employed in other applications.

Relative to the other embodiments, the current path from node X to output node through transistors 851 and 852 has been added. The PMOS transistor 851 will be turned on as transistor 821 is turned off. NMOS transistor 852 is diode connected and is preferable a native device. During the precharge phase prior to the enable signal being asserted, this allows a voltage higher than $V_{dd}$ to be applied to node Z from node X.

The design of FIG. 9 uses the boost-trap method to achieve a higher voltage at the output node Z than the maximum supply voltage $V_p$. When this boosted voltage is applied to the gate of the passgate 841, it produces a cancellation of the threshold voltage of transistor 841 when passing high voltage $V_p$ to WL 843.

To consider the operation of the circuit of FIG. 9, assume the maximum voltage supply is again, say, $V_p$=24 volts at all time, that the high logic level is $V_{dd}$ and the low level is 0 volts. There are two input controls: $V_{input}$ and $V_{enable}$, which are turned on sequentially. The output of this local pump is $V_Z$, which will go the gate of transistor 841.

During the standby phase, $V_p$=24 volts, $V_{input}$=$V_{enable}$=0V. For node V, connected to the gate of transistors 821 and 851, $V_V$=$V_{dd}$. Similarly, $V_Z$=0V, $V_X$=abs($V_{th,803}$), $V_a$=$V_{dd}$, and $V_Y$=0V, where abs($V_{th,803}$) is the absolute value of the threshold voltage of the native NMOS 803. Boosted node Z, which goes to the gate of the high voltage passgate transistors such as 841, is kept at 0V so there is no passing of high voltage. During the standby condition, PMOS 805 is in cut-off region so there is no current flow of the high voltage $V_p$ to $V_Y$.

When $V_{input}$ is enabled and switches from 0V to $V_{dd}$, $V_W$ is charged up to $V_{dd}$ and $V_X$ is charged up to $V_{dd}$+abs($V_{th,803}$). The signal on $V_V$ is delayed and inverted relative to $V_{input}$ and goes to ground after passing through inverters 831a–c. Transistors 851 and 852 are then enabled thereby allowing $V_X$ and $V_Z$ to be equalized to same potential. As long as the threshold voltage of transistor 803 is less than $V_Z$-$V_X$, the voltage source at $V_p$ will continuously charge up $V_X$ and, through 851 and 852, $V_Z$ until an equilibrium state is reached. The equilibrium state is determined by the pull-up of transistor 803 and the combined pull-down of transistor 805, transistor 809 and inverter 825b. For typical values of these elements, this voltage level could be around 10 volts.

During all the preceding operations, $V_Y$ must be kept close to the low voltage level, here ground, to allow the future boost from node X to be transferred better to node Z. During this phase, PMOS 805 could be slightly turned on, but $V_Y$ is kept near 0V strongly by transistor 809.

The purpose of introducing the elements PMOS 851 diode connected NMOS 852 is to allow node Z to be precharged to a higher level than the chip Power Supply $V_{dd}$. During this precharge phase, the voltage on the gate of PMOS 805 is coupled up by $V_X$ to reduce the leakage between nodes X and Y.

At certain determined time, determined for example by a global clock, the boost-trapping process is enabled. $V_{enable}$ is switched from low to high, and raises the input to transistor 809. Node Y is no longer being kept low and will by charged up quickly by X. In turn, $V_Z$ is boosted up by some percentage of $V_X$. 805, 853, and 809 are ratioed to allow 805 to conduct little current prior to the point $V_{enable}$ goes high. During the boost-trap phase, transistor 852 is diode connected between PMOS 851 and node Z. Since the node between PMOS 851 and NMOS 852 is at $V_X$, the path between PMOS 851 and $V_Z$ is cut off so that no charge on Z will be lost and no back leakage occurs.

The size of boost-trap capacitor 811 can be adjusted depending on the precharge level on $V_Z$ during the first phase of precharge ($V_{input}$=high, $V_{enable}$=low) and the capacitive loading on the output node Z. The higher $V_Z$ can be precharged, the smaller the capacitance of 811 can be.

During the discharge phase, $V_{input}$ and $V_{enable}$ are switched together from $V_{dd}$ to 0V and the circuit will return to the standby condition.

Unlike the embodiments of FIGS. 3 and 4, the embodiment of FIG. 9 uses two separate but related input signals, $V_{input}$ and $V_{enable}$. $V_{enable}$ is a delayed version of $V_{input}$ for the low to high edge and the same as $V_{input}$ for the high to low edge. This delay may be controlled, for example, by a global clock (not shown) external to circuit 800 or other mechanism after $V_{input}$ is enabled and switches high. When $V_{input}$ switches from 0v to $V_{dd}$ at time 0 ns, $V_{enable}$ will switch from 0v to $V_{dd}$ at a time of, say, 50 ns when the global clock switches from low to high. $V_{enable}$ is supplied to transistor 809 through the inverters 825a–b to reduce the loading as the node $V_Y$ is kept near 0V before $V_{enable}$ is asserted.

As already noted, the embodiment of FIG. 9 also introduces the new path between nodes X and Z. The diode connected transistor 852 is a preferably a native device to get the minimum voltage drop on node $V_Z$ from node $V_X$ due to the threshold value of the native device during the precharge phase. Alternately, 852 could be any other NMOS type device, but the lower its threshold, the higher the value of $V_Z$ close to $V_X$. The different device type, and its corresponding threshold voltage, will determine the initial precharge level on node Z, and consequently determine the size of boosting capacitor of 811.

The more the threshold voltage drop through transistor 852 due to body effect can be reduced, the higher the value of $V_Z$ voltage during the precharge phase and so the smaller size needed for capacitor 811. In the embodiments of FIGS. 3 and 4, node Z is precharged to only the $V_{dd}$ level in the best case with the subsequent boosting starting only from this level. This lower level requires a much larger boosting capacitor 311 or 411. The embodiment of FIG. 9 allows node Z to be precharged to an equilibrium point where $V_Z$ is much higher than $V_{dd}$, say 8 volts. At the equilibrium point, NMOS 852 should be cut off, or close to being cut off, by the body effect of its threshold voltage due to the equilibrium state between $V_X$ and $V_Z$ during the initialization phase.

Transistor 851 is a PMOS device. During standby, $V_X=V_{th,803}$ and $V_Z=0V$. PMOS 851 prevents current flow between nodes X and Z as the gate of 851 is at $V_{dd}$. When the circuit is enabled, 851 and 852 are used only in precharge phase. The more voltage drop between nodes X and Z is reduced, the higher the precharge on node Z. The equilibrium point will be the determined by the voltages $V_Z$ and $V_X$ and transistors 805 and 809.

During the boost phase when $V_Z$ is boosted high, the path between nodes Z and X should be disconnected. NMOS 852 supplies this function since the node between 851 and 852 is high enough during precharge to cut off 852 and preserve the charge on node Z from leaking onto node X.

The node Z is capacitively coupled on one side to node Y through capacitor 811. Node Z also has a number of parasitic capacitances on the other side due to the junction capacitances of transistors 852 and 821, the gate capacitances of transistor 803, and any load capacitances, here the gate capacitance of transistor 841. If the capacitance of capacitor 811 is called $C_2$ and the combined parasitic capacitance is called $C_1=C_{j,852}+C_{j,821}+C_{gate,803}+C_{gate,841}$, then the final voltage on node Z due to charge conservation, $V_{final}$ on node Z is given by $$V_{final}=V_{precharge}+(C_2/(C_1+C_2))V_p,$$

where $V_{precharge}$ is the level on node Z in the initialization phase. Thus $V_{final}$ depends on $V_{precharge}$, $C_1$, $C_2$, and $V_{pp}$. As C1 and $V_{pp}$ are more or less fixed, the value of $V_{final}$ is most easily changed by either increasing $V_{precharge}$ or making $C_2$ much larger than $C_1$. As increasing capacitance is generally expensive, to obtain a given $V_{final}$ value it is generally preferable to increase $V_{precharge}$. As described, the path between nodes Z and X through PMOS 851 and NMOS 852 of the embodiment of FIG. 9 allows this initialization value to be set higher and, consequently, reduce the size of capacitor 811.

Referring back to FIG. 2, as in the embodiment of FIG. 4, the embodiment of FIG. 9 again applies the input signal to node a and node Z when $V_{input}$ is first asserted. Unlike the earlier embodiments, after a delay the path between node X and Y is then opened during the initialization phase to obtain the higher value for $V_{precharge}$. This path is then closed again in the enable phase after $V_{enable}$ is asserted. Also unlike the earlier embodiments, the voltage level at node b is not supplied directly by $V_{input}$.

The gate of PMOS 805 is connected to $V_{dd}$ through the diode connected transistor 853. During standby, the voltage on the gate of PMOS 805 is given by $V_b=(V_{dd}-V_{th,853})$, where the threshold voltage $V_{th,853}$ of NMOS 853 is preferably close to 0V. Consequently, the path from node X to node Y is cut off and $V_X=(V_{dd}-V_{th,803})$ while $V_Y=0V$. During the initialization of the precharge phase, $V_X$ and $V_Z$ will rise to the equilibrium level of, say, 8V. As the gate of 805 is coupled up through the gate-source overlap capacitance, $C_{jo}$, the level on the gate is dependent on the coupling ratio, having a value of, say, 4V in an exemplary embodiment. This will turn on PMOS 805 weakly and reduce the pull up strength than with its gate fixed at $V_{dd}$. However, $V_Y$ is kept close to 0v with by maintaining $V_{enable}$ low. The strong pulldown of transistor 809 and inverter 825b is used to keep $V_Y \approx 0v$ and $V_Z \approx 8v$. This is the pre-condition to set up the boost trapping process. The combination of the strong pulldown on node Y and strong pullup on node Z is used to set up this equilibrium in the initialization phase.

When the enable signal is asserted and $V_{enable}=V_{dd}$, the equilibrium state between transistors 803, 805, 809 and inverter 825B is broken and the node Z is boosted to, say, $V_Z=26V$.

More generally, the arrange of FIG. 9 for the operation of PMOS 805 can also be used in the corresponding element (305, 405) of the first and second exemplary embodiments of FIGS. 3 and 4. Conversely, in circuit 800 of FIG. 9, the gate of PMOS could alternately be controlled by inverting the enable or input signal with proper delay. Boosting the voltage on the gate of PMOS 805 as in FIG. 9 reduces the power consumption from the voltage source at $V_p$.

The operation of circuit 800 is shown in FIG. 10. This shows the values of $V_Z$ and $V_Y$ for two different load levels on the output and the voltage level on the gate of PMOS 805. The level of the load corresponds to the $C_{gate,841}$ term of $C_2$ in the expression for $V_{final}$ above. Lines 901 and 902 respectively correspond to $V_Z$ and $V_Y$ for a higher load, lines 911 and 912 respectively correspond to the same nodes for a lesser load, and line 920 is the voltage on the gate of PMOS 805. As in the earlier figures, FIG. 10 again uses the exemplary values of $V_{dd}=1.6V$ and $V_p=24V$. On the time scale along the bottom, the initialization phase begins at time 0 and runs to 400 ns, the enabled phase from 400 ns to 3 $\mu$s, and the system returns to standby after 3 $\mu$s.

During standby mode, as shown at time 0, $V_Z$ for both loads (901 and 911) and $V_Y$ for both loads (902 and 912) are at the lower logic level of 0V while the gate of PMOS 805 (920) is at $V_{dd}$ less any voltage drop across 853. At time 0, the initialization phase begins when $V_{in}$ goes high. Node Z quickly rises, first due to the input signal passing through transistor 821 to node W, followed by the path from node X to node Z opening. For the exemplary values, this take $V_Y$ to around 9V, with the value for the higher load (901) being slightly higher than for the lower load (911). Through the coupling by its overlap capacitance, the gate of PMOS 805 is taken to near 8V (920), while $V_Y$ (902 and 912) are held near ground by the pulldown.

At 400 ns, $V_{enable}$ goes high and the circuit passes into the enabled phase. The gate voltage of PMOS 805 jumps to near 20V and then decays back towards around 6V (920). $V_Y$ rises to just under $V_p=24V$, with the value for the higher load (902) lying slightly above the value for the loser load (912). The output voltage on node Z rises to over the value of the voltage source: for the higher load (901) $V_Z \approx 26.5V$ and for the lower load (911) $V_Z \approx 25V$ for the exemplary values. In both cases, $V_Z$ is boosted over the value of $V_{pp}$ to offset body effects in the pass gate 841.

At 3 $\mu$s, both the input and enable signals are de-asserted. The voltage on the gate of PMOS 805 (920) bounces down below ground and returns back to around $V_{dd}$. $V_Y$ (902, 912) go quickly to ground, closely followed by $V_Z$ (901, 911), to return the circuit to the standby state.

The exemplary embodiments have been discussed in the context of a wordline select circuit, although the uses of the present invention extend to broader application. The $V_p$ and $V_{in}$ values need not be, respectively, as high and as low as those described, but the present invention is able to operate into these more difficult ranges or whenever there a need to speed up the transition time of a high voltage switch.

Although the various aspects of the present invention have been described with respect to specific exemplary embodiments, it will be understood that the invention is entitled to protection within the full scope of the appended claims.

It is claimed:

1. A circuit to supply at an output a voltage derived from a voltage source in response to an input signal, comprising:
   a native NMOS transistor connected between the voltage source and a first node and having a control gate connected to the output through a third node connected to receive the input signal;
   a PMOS transistor connected between the first node and a second node; and
   a capacitor connected between the second node and the output connected to receive a delayed version of the input at the second node.

2. The circuit of claim 1, wherein the gate of the PMOS transistor is connected to receive a delayed and inverted version of the input signal.

3. The circuit of claim 2, further comprising:
   a first transistor connected between the input and the third node, whereby the third node receives the input signal; and
   a second transistor connected between the input and the second node and having a gate connected to receive a voltage corresponding to the high value of the input, whereby the second node receives the delayed version of the input.

4. The circuit of claim 3, wherein the gate of the first transistor is connected to receive a voltage corresponding to the high value of the input.

5. The circuit of claim 3 wherein the first transistor is a native NMOS transistor.

6. The circuit of claim 5, wherein the gate of the first transistor is connected to receive the delayed and inverted version of the input signal.

7. The circuit of claim 5, further comprising:
   three inverters connected in series to receive the input, whereby the delayed and inverted version of the input is provided to the gate of the first transistor.

8. The circuit of claim 3, further comprising:
   a pair of inverters connected in series to receive the input, whereby the delayed version of the input is provided to the second transistor.

9. The circuit of claim 2, further comprising:
   three inverters connected in series to receive the input, whereby the delayed and inverted version of the input is provided to the gate of the PMOS transistor.

10. The circuit of claim 2, wherein the voltage source has a value of over twenty volts.

11. The circuit of claim 2, wherein the voltage difference between the high and low values of the input is in the range of from 1.6 volts to 4 volts.

12. A non-volatile memory system, comprising:
    a transistor;
    one or more storage elements; and
    a circuit to supply at an output a voltage derived from a voltage source in response to an input signal, the circuit comprising:
      a native NMOS transistor connected between the voltage source and a first node and having a control gate connected to the output through a third node connected to receive the input signal;
      a PMOS transistor connected between the first node and a second node, wherein the gate of the PMOS transistor is connected to receive the inverted, delayed input signal; and
      a capacitor connected between the second node and the output connected to receive a delayed version of the input at the second node; and
    where the output of the circuit is connected to the gate of the transistor whereby a programming voltage is supplied to said one or more storage elements of the non-volatile memory.

13. A system including:
    a circuit to supply at an output a voltage derived from a voltage source in response to an input signal, comprising:
      a native NMOS transistor connected between the voltage source and a first node and having a control gate connected to the output through a third node connected to receive the input signal,
      a PMOS transistor connected between the first node and a second node, and
      a capacitor connected between the second node and the output connected to receive a delayed enable signal at the second node, wherein the delayed enable signal is derived from the input signal, and wherein the first node and the output are connected so that current flows from the first node to the output in response to the delayed input signal, wherein the delayed enable signal is delayed relative to the input signal when the input signal is asserted and wherein the delayed enable signal is the same the input signal when the input signal is de-asserted; and
    a clock, whereby the delay of the enable signal relative to the input signal when the input signal is asserted is determined by the clock.

14. A circuit to supply at an output a voltage derived from a voltage source in response to an input signal, comprising:
    a native NMOS transistor connected between the voltage source and a first node and having a control gate connected to the output through a third node connected to receive the input signal;
    a PMOS transistor connected between the first node and a second node; and
    a capacitor connected between the second node and the output connected to receive a delayed enable signal at the second node, wherein the delayed enable signal is derived from the input signal, and wherein the first node and the output are connected so that current flows from the first node to the output in response to a delayed version of the input signal.

15. The circuit of claim 14, wherein the enable signal is delayed relative to the input signal when the input signal is asserted and wherein the enable signal is the same as the input signal when the input signal is de-asserted.

16. The circuit of claim 15, further comprising:
    a first transistor connected between the first node and an intermediate node; and
    a second transistor connected between the intermediate node and the output, wherein the first transistor is a PMOS transistor whose gate is connected to receive a delayed and inverted version of the input, wherein the second transistor is an NMOS transistor whose gate is connected to the intermediate node, and whereby the first node and the output are connected so that current flows from the first node to the output in response to the delayed input signal.

17. The circuit of claim 16, wherein the second transistor is a native NMOS transistor.

18. The circuit of claim 16, further comprising:
    a diode connected transistor connected between the gate of the PMOS transistor and the high level of the input.

19. The circuit of claim 16, further comprising:
a third transistor connected between the input and the third node, whereby the third node receives the input signal; and
a fourth transistor connected between the enable signal and the second node and having a gate connected to receive a voltage corresponding to the high value of the input, whereby the second node receives the delayed enable signal.

20. The circuit of claim 19, wherein the third transistor is a native NMOS transistor.

21. The circuit of claim 20, wherein the gate of the third transistor is connected to receive the inverted delayed input signal.

22. The circuit of claim 20, further comprising:
three inverters connected in series to receive the input, whereby the inverted, delayed input is provided to the gate of the first transistor and the gate of the third transistor.

23. The circuit of claim 19, further comprising:
a pair of inverters connected in series to receive the enable signal, whereby the delayed enable signal is provided to the fourth transistor.

24. The circuit of claim 15, wherein the voltage source has a value of over twenty volts.

25. The circuit of claim 15, wherein the voltage difference between the high and low values of the input is in the range of from 1.6 volts to 4 volts.

26. A non-volatile memory system, comprising:
a transistor;
one or more storage elements; and
a circuit to supply at an output a voltage derived from a voltage source in response to an input signal, comprising:
a native NMOS transistor connected between the voltage source and a first node and having a control gate connected to the output through a third node connected to receive the input signal,
a PMOS transistor connected between the first node and a second node, and
a capacitor connected between the second node and the output connected to receive a delayed enable signal at the second node, wherein the delayed enable signal is derived from the input signal, and wherein the first node and the output are connected so that current flows from the first node to the output in response to the delayed input signal, wherein the delayed enable signal is delayed relative to the input signal when the input signal is asserted and wherein the delayed enable signal is the same as the input signal when the input signal is de-asserted; and
where the output of the circuit is connected to the gate of the transistor whereby a programming voltage is supplied to said one or more storage elements of the non volatile memory.

27. A method of generating a voltage at an output, comprising:
providing a circuit connected between the output and a voltage source, comprising:
a native NMOS transistor;
a PMOS transistor; and
a capacitor, wherein the native transistor, the PMOS transistor and the capacitor are connected in series, the native NMOS transistor between the voltage source and the PMOS transistor, the PMOS transistor between the native NMOS transistor and the capacitor, and the capacitor between the PMOS transistor and the output;
receiving an input;
supplying the input to the gate of the native NMOS transistor;
supplying the input to the terminal of the capacitor connected to the output; and
supplying the input to the terminal of the capacitor connected to the PMOS transistor, wherein said supplying the input to the terminal of the capacitor connected to the PMOS transistor is subsequent to said supplying the input to the gate of the native NMOS transistor and supplying the input to the terminal of the capacitor connected to the output.

28. The method of 27, further comprising:
providing a circuit connected between the output and a voltage source, comprising:
supplying the inverted input to the gate of the PMOS transistor, wherein said supplying the inverted input to the gate of the PMOS transistor is subsequent to said supplying the input to the gate of the native NMOS transistor and supplying the input to the terminal of the capacitor connected to the output.

29. The method of claim 28, further comprising:
trapping the input on the gate of the native NMOS transistor subsequent to supplying the input to the gate of the native NMOS transistor; and
trapping the input on the terminal of the capacitor connected to the output subsequent to supplying the input to the terminal of the capacitor connected to the output.

30. The method of claim 28, further comprising:
trapping the input on the terminal of the capacitor connected to the PMOS transistor subsequent to supplying the input to the terminal of the capacitor connected to the PMOS transistor.

31. The method of claim 30, wherein the input to the gate of the native NMOS transistor and to the terminal of the capacitor connected to the output is supplied at a voltage value increased above the received voltage value of the input.

32. The method of claim 28, wherein the voltage difference between the high and low values of the input is in the range of from 1.6 volts to 4 volts.

33. The method of claim 28, wherein the voltage source has a value of over twenty volts.

34. The method of claim 28, wherein the output is supplied to the pass gate of a wordline select circuit in a non-volatile memory.

35. A method of generating a voltage at an output, comprising:
providing a circuit connected between the output and a voltage source, comprising:
a native NMOS transistor;
a PMOS transistor; and
a capacitor, wherein the native transistor, the PMOS transistor and the capacitor are connected in series, the native NMOS transistor between the voltage source and the PMOS transistor, the PMOS transistor between the native NMOS transistor and the capacitor, and the capacitor between the PMOS transistor and the output, and wherein a node between the native NMOS transistor and the PMOS transistor is connectable to the terminal of the capacitor connected to the output;
receiving an input;

supplying the input to the gate of the native NMOS transistor;

supplying the input to the terminal of the capacitor connected to the output; and supplying a signal derived from the input to the terminal of the capacitor connected to the PMOS transistor, wherein said node is connected to the terminal of the capacitor connected to the output only when the input is asserted and the signal derived from the input is de-asserted.

36. The method of 35, wherein the signal derived from the input is a delayed version of the input when the input signal is asserted and is a non-delayed version at other times.

37. The method of claim 36, further comprising:

trapping the input on the gate of the native NMOS transistor subsequent to supplying the input to the gate of the native NMOS transistor; and trapping the input on the terminal of the capacitor connected to the output subsequent to supplying the input to the terminal of the capacitor connected to the output.

38. The method of claim 36, further comprising:

trapping the input on the terminal of the capacitor connected to the PMOS transistor subsequent to supplying the input to the terminal of the capacitor connected to the PMOS transistor.

39. The method of claim 38, wherein the input to the gate of the native NMOS transistor and to the terminal of the capacitor connected to the output is supplied at a voltage value increased above the received voltage value of the input.

40. The method of claim 36, wherein the voltage difference between the high and low values of the input is in the range of from 1.6 volts to 4 volts.

41. The method of claim 36, wherein the voltage source has a value of greater than twenty volts.

42. The method of claim 36, wherein the output is supplied to the pass gate of a wordline select circuit in a non-volatile memory.

43. The method of claim 36, wherein said node is connected to the terminal of the capacitor connected to the output in response to the delayed version of the input.

44. The method of claim 36, wherein when said node is connected to the terminal of the capacitor connected to the output, the voltage supplied from the node to the terminal of the capacitor connected to the output is increased above the voltage value of the node.

45. The method of 35, wherein the gate of the PMOS transistor is connected to the high value of the input through a diode element.

46. A non-volatile memory comprising:

a storage element;

a voltage source;

a switch for connecting the storage element to the voltage source; and a circuit connected to the voltage source and to receive an input signal, having an output connected to control the switch, the circuit comprising:

a native NMOS transistor connected between the voltage source and a first node and having a control gate connected to the output through a third node connected to receive the input signal;

a PMOS transistor connected between the first node and a second node; and a capacitor connected between the second node and the output connected to receive a signal derived from the input signal at the second node.

* * * * *